United States Patent
Ishida et al.

(10) Patent No.: US 6,690,249 B2
(45) Date of Patent: Feb. 10, 2004

(54) POWER SPLITTER/COMBINER MULTI-LAYER CIRCUIT

(75) Inventors: Kaoru Ishida, Shijonawate (JP); Masayuki Miyaji, Takarazuka (JP); Hiroaki Kosugi, Hirakata (JP); Shin'ichi Kugou, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/102,732

(22) Filed: Mar. 22, 2002

(65) Prior Publication Data

US 2002/0097088 A1 Jul. 25, 2002

Related U.S. Application Data

(62) Division of application No. 09/758,427, filed on Jan. 12, 2001, now Pat. No. 6,563,395, which is a division of application No. 09/150,012, filed on Sep. 4, 1998, now Pat. No. 6,201,439.

(30) Foreign Application Priority Data

Sep. 17, 1997 (JP) .............................. 9-252417
Sep. 17, 1997 (JP) .............................. 9-252419

(51) Int. Cl.[7] ................................. H01P 5/12
(52) U.S. Cl. ....................... 333/128; 333/136
(58) Field of Search .................... 333/128, 136

(56) References Cited

U.S. PATENT DOCUMENTS

| 4,647,868 A | 3/1987 | Mueller ................ 330/286 |
| 4,739,289 A | 4/1988 | Cripps ................. 222/26 |
| 4,755,775 A | 7/1988 | Marczewski et al. ......... 333/26 |
| 5,017,886 A | 5/1991 | Geller ................. 330/277 |
| 5,061,910 A | 10/1991 | Bouny ................. 333/26 |
| 5,451,914 A | 9/1995 | Stengel ............... 333/26 X |
| 5,467,064 A | * 11/1995 | Gu ................ 333/128 |
| 5,497,137 A | 3/1996 | Fujiki |

(List continued on next page.)

FOREIGN PATENT DOCUMENTS

| JP | 5-191116 | 7/1993 |
| JP | 8-28607 | 3/1996 |

OTHER PUBLICATIONS

Dye, et al., "Radio Frequency Transistors," Butterworth/Heinemann, 1993, pp. 113–116 and pp. 179–181.

Bassett, Microwaves, 19:7, 47–52, Jul. 1980.

(List continued on next page.)

Primary Examiner—Benny Lee
(74) Attorney, Agent, or Firm—Smith, Gambrell & Russell, LLP

(57) ABSTRACT

A high power amplifier has a first balun propagating a half of an input signal to an in-phase output terminal, and also propagating a fourth of the input signal to first and second opposite-phase output terminals, the signal propagated to the first and second opposite-phase output terminals lagging 180 degrees behind the signal propagated to the in-phase output terminal; first and second power amplifier circuits connected to the first and second opposite-phase output terminals of the first balun and having the same characteristics; a third power amplifier circuit connected to the in-phase output terminal of the first balun and having output power substantially twice as much as the output power of the first or second power amplifier circuit; and a second balun having first and second opposite-phase input terminals for receiving the outputs of the first and second power amplifier circuits, having an in-phase input terminal for receiving the output of the third power amplifier circuit, combining the outputs of the first, second and third power amplifier circuits, and propagating combined output.

2 Claims, 15 Drawing Sheets

U.S. PATENT DOCUMENTS

| | | | |
|---|---|---|---|
| 5,523,728 A | 6/1996 | McCorkle | 333/128 |
| 5,644,272 A | 7/1997 | Dabrowski | |
| 6,201,439 B1 * | 3/2001 | Ishida et al. | 333/26 X |
| 2002/0008599 A1 * | 1/2002 | Sridharan et al. | 333/128 |

OTHER PUBLICATIONS

Takao Hasegawa, et al., "Multi–Branch Power Dividers Using Multilayer MMIC Technology," IEICE Transactions on Electronics, vol. E75–C, No. 6, Jun. (1992), pp. 707–712.

Kenjiro Nishikawa, et al., "Miniaturized Wilkinson Power Divider Using Three–Dimensional MMIC Technology," IEEE Microwave and Guided Wave Letters, vol. 6, No. 10, Oct., 1996, pp. 372–374.

T. Gokdemir, et al, "Design and Performance of GaAs MMIC CPW Baluns Using Overlaid and Spiral Couplers," 1997 IEEE MTT–S International Microwave Symposium Digest, published Jun. 8, 1997, pp. 401–404.

Copy of European Communication for counterpart application No. EP 99 11 7393, dated Apr. 19, 2001.

European Search Report dated May 22, 2003 (Application No. EP 03 00 9622).

* cited by examiner

POWER SPLITTER/COMBINER MULTI-LAYER CIRCUIT

CROSS REFERENCE TO RELATED APPLICATION

This application is a division of Ser. No. 09/758,427, filed Jan. 12, 2001 (U.S. Pat. No. 6,563,395), which is a division of Ser. No. 09/150,012, filed Sep. 9, 1998 (U.S. Pat. No. 6,201,439), each application being incorporated herein, in their entirety, by reference.

BACKGROUND OF THE INVENTION

1. Field of the Invention

The present invention relates to a high power amplifier mainly used at a cellular phone base station, and a balun circuit for the high power amplifier.

2. Related Art of the Invention

A high power amplifier capable of propagating several tens of watts to several hundreds of watts has recently been used at a digital mobile communication base station. This kind of high power amplifier comprises a plurality of push-pull amplifiers combined in parallel to obtain high power, wherein each push-pull amplifier comprises two identical transistors connected in parallel and supplied with signals 180 degrees out of phase with respect to each other. The explanation of the push-pull amplifier has been given on pages 113 to 116 of "Radio Frequency Transistors" written by Norm Dye and Helge Granberg, published by Butterworth/Heinemann. Therefore, no detailed explanation is given here. This power amplifier circuit requires a power splitter/combiner circuit and baluns at each of the input and output of the circuit.

A conventional high power amplifier will ho described below referring to FIG. 11. In FIG. 11, the numeral 501 designates a n-way rower splitter, the numeral 502 designates a n-way power combiner, and the numerals 503, 504 designate n baluns and the numeral 505 designates n pairs of push-pull amplifiers. A power splitter/combiner circuit used in this configuration will be described below referring to FIGS. 12A, 12B and 13. FIGS. 12A, 12B and 13 show the configurations of Wilkinson power splitter circuits. FIG. 12A shows a general Wilkinson power splitter circuit. The numeral 601 designates an input terminal, the numeral 602 designates n quarter-wavelength lines, the numeral 603 designates n isolation resistors, and the numeral 604 designates n output terminals. FIG. 12B shows a tree configuration of two-way-splitters capable of being configured as a plane circuit. The numeral 605 designates an input terminal, the numeral 606 designates two quarter-wavelength lines, the numeral 607 designates an isolation resistor, the numeral 608 designates four quarter-wavelength lines, the numeral 609 designates two isolation resistors, and the numeral 610 designates four output terminals. In addition, FIG. 13 shows an asymmetric power splitter type. The numeral 611 designates an input terminal, the numerals 612, 613, 616 and 617 designates quarter-wavelength lines having characteristic impedances different from one another, the numerals 614 and 618 designate isolation resistors, and the numeral 615, 619 and 620 designate impedance transformer circuits. The explanation of Wilkinson power combiner circuit has been given on pages 205 to 210 of "Foundations of Microwave Circuits and Applications thereof" written by Yoshihiro Konishi, published by Sogo Denshi. Therefore, no detailed explanation is given here.

FIG. 14 shows the configuration of a conventional balun. The numeral 701 designates an unbalanced terminal, the numeral 702 designates a quarter-wavelength coaxial line having a characteristic impedance of 50 Ω, the numeral 703 designates an in-phase output terminal, and the numeral 704 designates an opposite-phase output terminal. The explanation of the balun has been given on pages 179 to 181 of "Radio Frequency Transistors" written by Norm Dye and Helge Granberg, published by Butterworth/Heinemann. Therefore, no detailed explanation is given here.

On the basis of the above-mentioned configurations, the conventional high power amplifier has obtained high power for transmission at a base station by combining a plurality of output powers of push-pull amplifiers.

Although the Wilkinson power splitter circuit shown in FIG. 12A can evenly split power into n-way port at one time, the circuit cannot be attained as a plane circuit. For this reason, the configurations shown in FIGS. 12B and 13 are used generally. The configuration shown in FIG. 12B, however, loads to large loss in splitter/combiner due to a long transmission path. In addition, the configuration also has a problem of low versatility, because power can be split and propagated only to $2^n$ paths. Furthermore, the configuration shown in FIG. 13 has a problem of unbalanced power splitting, because transmission paths length are different one output to another. Moreover, the balun shown in FIG. 14 is large in circuit size because of the use of the coaxial line, thereby having a problem of difficulty in miniaturization.

SUMMARY OF THE INVENTION

In order to solve these problems encountered in the conventional high power amplifier circuit, an object of the present invention is to provide a high power amplifier circuit having a drastically reduced circuit size due to use of decreased number of components.

For example, a high power amplifier circuit in accordance with the present invention comprises Wilkinson n-splitter/n-combiner circuits, and baluns, each having an input, an in-phase output and two opposite-phase outputs, on a single multilayer board formed of a plurality of stacked dielectric plates.

In the high power amplifier in accordance with the present invention, a Wilkinson power splitter for four or more splits, having been difficult to be attained as a plane circuit, is attained by using a multilayer board and by connecting isolation resistors to a common terminal via a through hole. In addition, a balun, having been configured by using a coaxial line, is configured by using a multilayer board and by providing coupling lines on the layers above and below a strip line, thereby to obtain two opposite-phase outputs. With this configuration, power splitter/combiner circuits and baluns can be formed on a single multilayer board, whereby the high power amplifier circuit can be miniaturized drastically. In addition, since the balun can propagate two opposite-Phase outputs, the number of splits can be reduced, whereby the circuit size of the splitter can be made smaller. In addition, since n-splitting/n-combining functions can be carried out at one time, loss can be reduced, whereby the efficiency of the power amplifier can be improved.

Furthermore, another object of the present invention is to make the circuit further smaller.

In order to attain the objects, the present invention offers such a high power amplifier having:

a first balun propagating a half of an input signal to an in-phase output terminal, and also propagating a fourth of the input signal to first and second opposite-phase output terminals, the signal propagated to the first and second opposite-phase output terminals lagging 180 degrees behind the signal propagated to the in-phase output terminal;

first and second power amplifier circuits connected to the first and second opposite-phase output terminals of the first balun and having identical characteristics;

a third power amplifier circuit connected to the in-phase output terminal of the first balun and having output power substantially twice as much as the output power of the first or second power amplifier circuit; and a second balun having first and second opposite-phase input terminals for receiving the outputs of the first and second power amplifier circuits, having an in-phase input terminal for receiving the output of said third power amplifier circuit, combining the outputs of the first, second and third power amplifier circuits, and propagating combined output.

Figure 1:
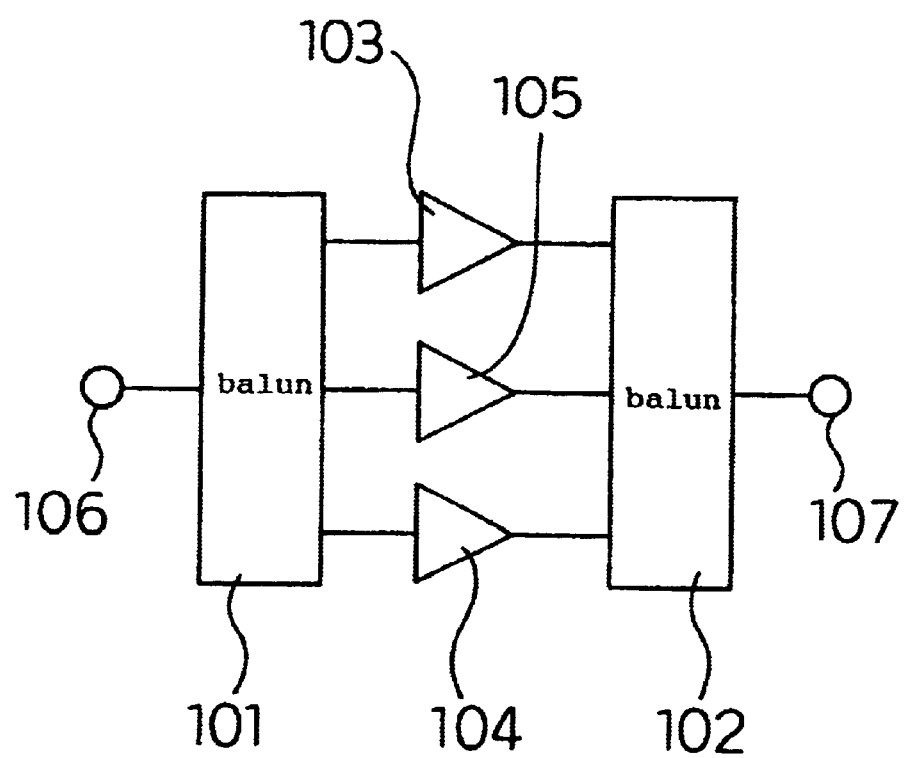
FIG. 1 is a view showing the configuration of a high power amplifier in accordance with a first embodiment of the present invention.

DESCRIPTION OF REFERENCE CODES 101, 102 baluns
207 main line
208 first coupling line
209 second coupling line
214 in-phase output terminal
215 first opposite-phase output terminal
216 second opposite-phase output terminal
301, 302 power 4-splitters
303 high power amplifier
407–410 first to fourth quarter-wavelength lines
411–414 first to fourth isolation resisitors
421–424 first to fourth 4-split output terminals
501 n-way power splitter
502 n-way power combiner
503, 504 baluns
505 push-pull amplifier
1010, 1020, 2010–2040, 3010–3050 dielectric layers
1030, 2050, 3060 input lines
1040 main line
1050, 1060, 2080, 2090, 3090, 3100 coupling lines
1070, 1080, 2100, 2110, 3110, 3120 output line pairs
1090, 1100, 2120–2160, 3130–3170 through holes
1110–1130, 2170–2210, 3180–3220 grounding conductors
2060, 2070, 3070, 3080 main line portions
3230 shield conductor layer
7040, 8040 part of main line
7050, 8050 coupling line Preferred Embodiments of the Invention The present invention will be described below referring to the accompanying drawings showing embodiments thereof.

(First Embodiment)

FIG. 1 is a view showing the configuration of a high power amplifier in accordance with a first embodiment of the present invention. Referring to FIG. 1, the numerals 101, 102 designate baluns, the numerals 103, 104 designate power amplifiers having identical characteristics, the numeral 105 designates a power amplifier generating output power twice as high as that of the power amplifier 103 or 104, the numeral 106 designates an input terminal, and the numeral 107 designates an output terminal.

Figure 2A:
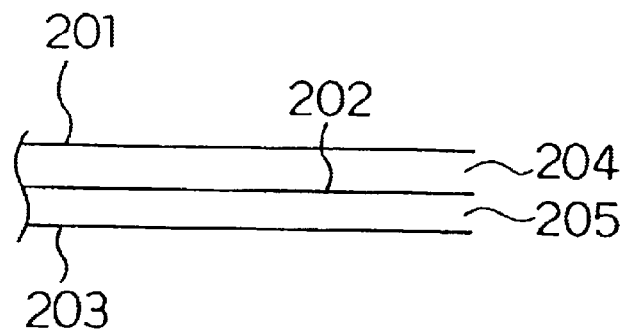
FIG. 2A is a sectional view showing a balun for the high power amplifier in accordance with the first embodiment.
Figure 2B:
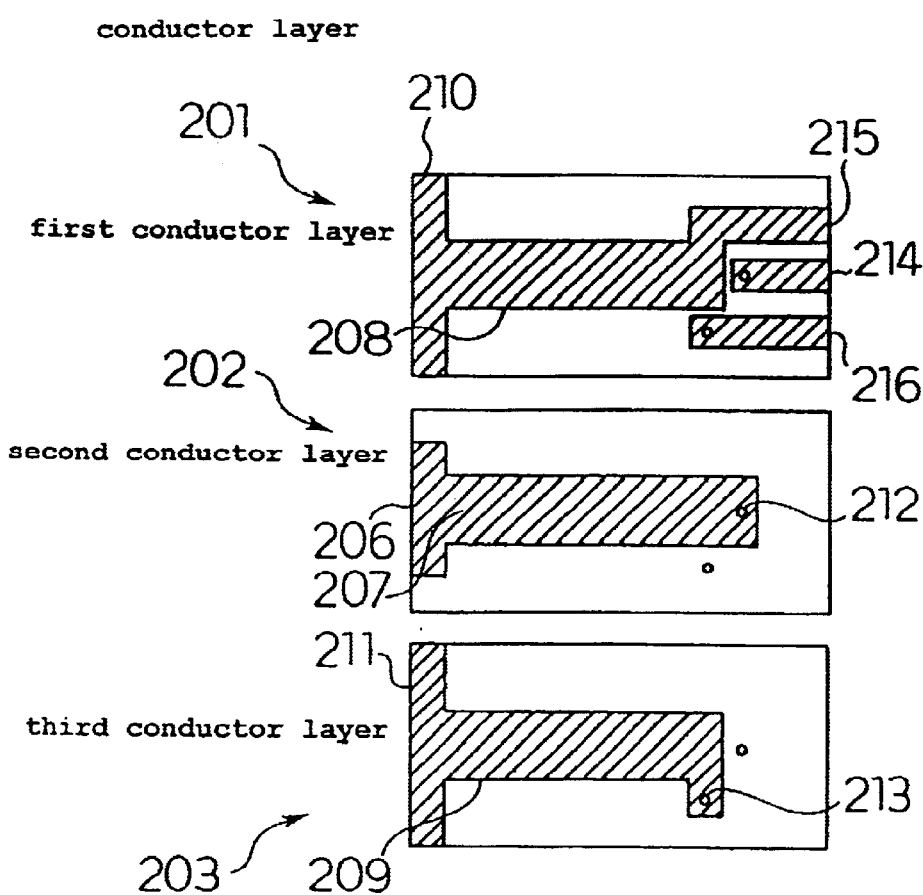
FIG. 2B is a view showing the conductor patterns of the balun.

In this configuration, a balun used for the present invention will be detailed below referring to FIGS. 2A to 2C. FIG. 2A is a sectional view showing a balun formed of a dielectric multilayer board, FIG. 2B is a view showing conductor patterns on each conductor pattern layer, and FIG. 2C is a view illustrating the operation of the balun.

Referring to FIG. 2A, the numerals 201, 202, 203 designate first to third conductor pattern layers, and the numerals 204, 205 designate first and second dielectric layers. Referring to FIG. 2B, the top drawing shows the first conductor pattern layer 201, the middle drawing shows the second conductor pattern layer 202, and the bottom drawing shows the third conductor pattern layer 203. The numeral 206 designates an input terminal provided on the second conductor pattern layer 202, to which signals are input. The numeral 207 designates a main line connected to the input terminal. At the other end of the main line, a first through hole 212 is formed. The numeral 208 designates a first coupling line provided on the first conductor pattern layer 201. The numeral 209 designates a second coupling line provided on the third conductor pattern layer 203. The main line and the coupling lines are formed at positions so as to be in face-to-face relationship with one another, and are coupled electromagnetically. The numeral 210 designates a first grounding conductor provided on the first conductor pattern layer 201, and the numeral 211 designates a second grounding conductor provided on the third conductor pattern layer 203. The grounding conductors 210, 211 are connected to the coupling lines 208, 209, respectively. The numeral 212 designates the first through hole formed at the other end of the main line 207, and the numeral 213 designates a second through hole formed at the other end of the second coupling line 209. The numeral 214 designates an in-phase output terminal formed on the first conductor pattern layer 201 and connected to the first through hole. The numeral 215 designates a first opposite-phase output terminal formed at the other end of the first coupling line 208 on the first conductor pattern layer 201. The numeral 216 designates a second opposite-phase output terminal formed on the first conductor pattern layer 201 and connected to the second through hole 213. Referring to FIG. 2C, the numeral 217 designates an input terminal, the numeral 218 designates a main line, the numerals 219, 220 designate first and second coupling lines, respectively. The numeral 221 designates an in-phase output terminal. The numerals 222, 223 designate first and second opposite-phase output terminals, respectively.

Figure 2C:
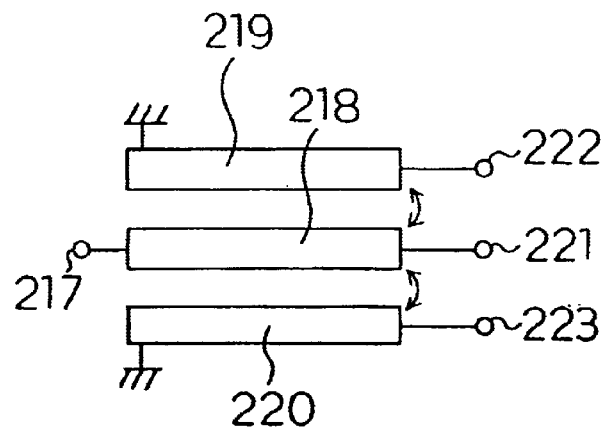
FIG. 2C is a view illustrating the operation of the balun.
Figure 2D:
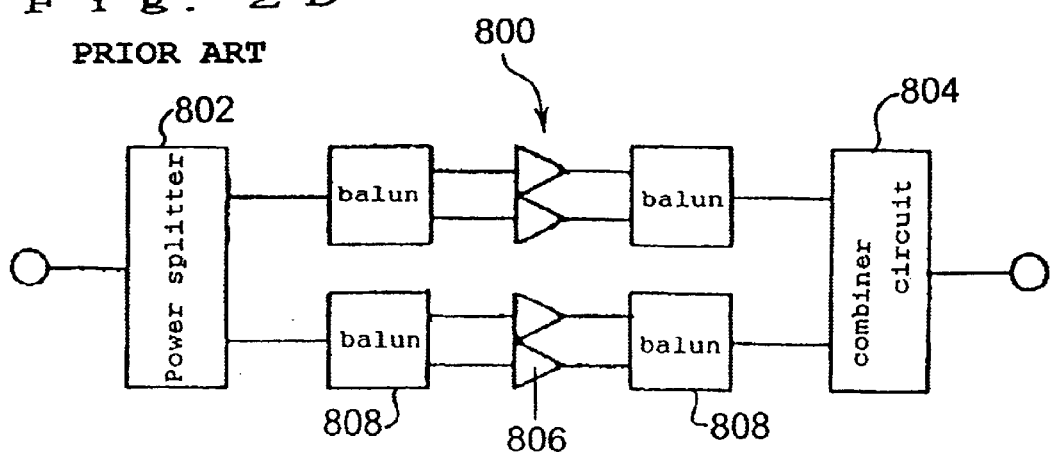
FIG. 2D is a schematic view showing a conventional high power amplifier comprising two power splitter/combiner circuits and four baluns.

Referring to FIG. 2C, a radio-frequency signal input from the input terminal 217 is split in terms of power and propagated to the first coupling line 219 and the second coupling line 220, which are coupled at an appropriate coupling degree. By grounding the input terminal sides of the first and second coupling lines, the output signals at the first and second opposite-phase output terminals are 180 degrees out of phase with the input signal. The coupling degree is determined depending on the dielectric constant and thickness of the dielectric and the widths of the main line and the coupling lines. In the present embodiment, a balun having the above-mentioned configuration and capable of obtaining one in-phase output and two opposite-phase outputs from one input is used at the input and output of the embodiment. Consequently, the number of components in the high power amplifier of the present embodiment can be made less than the number of components in a conventional high power amplifier 800 shown in FIG. 2D, comprising two power splitter/combiner circuits 802, 804, amplifiers 806, and four baluns 808, whereby the circuit of the power amplifier can be made smaller.

(Second Embodiment)

Figure 3:
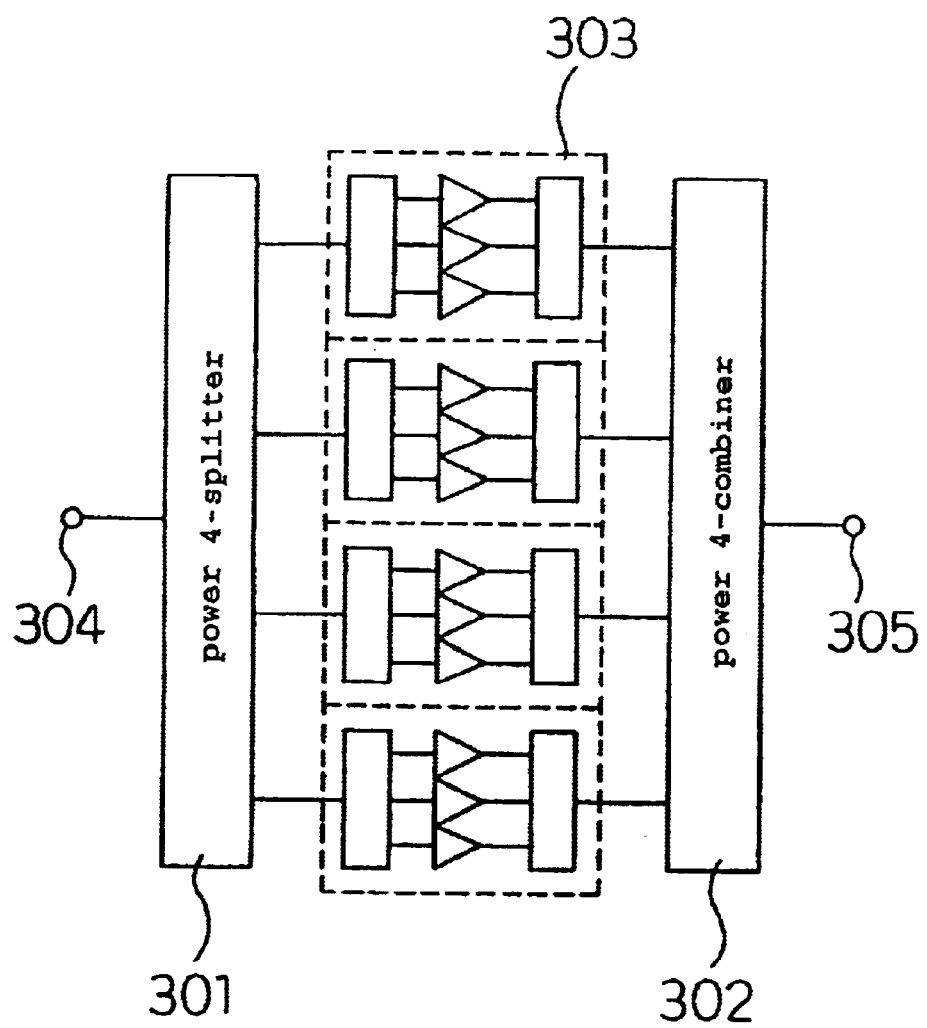
FIG. 3 is a view showing the configuration of a high power amplifier in accordance with a second embodiment of the present invention.

FIG. 3 is a view showing the configuration of a high power amplifier in accordance with a second embodiment of the present invention. Referring to FIG. 3, the numerals 301, 302 designate four-way power splitter/combiners, the numeral 303 designates the high power amplifier described in the explanation of the first embodiment, the numeral 304 designates an input terminal, and the numeral 305 designates an output terminal.

Figure 4A:
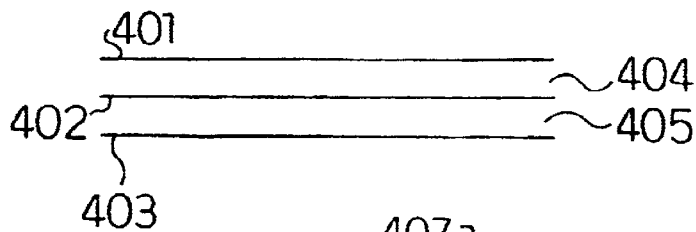
FIG. 4A is a sectional view showing a four-way power splitter for the high power amplifier in accordance with the second embodiment.
Figure 4B:
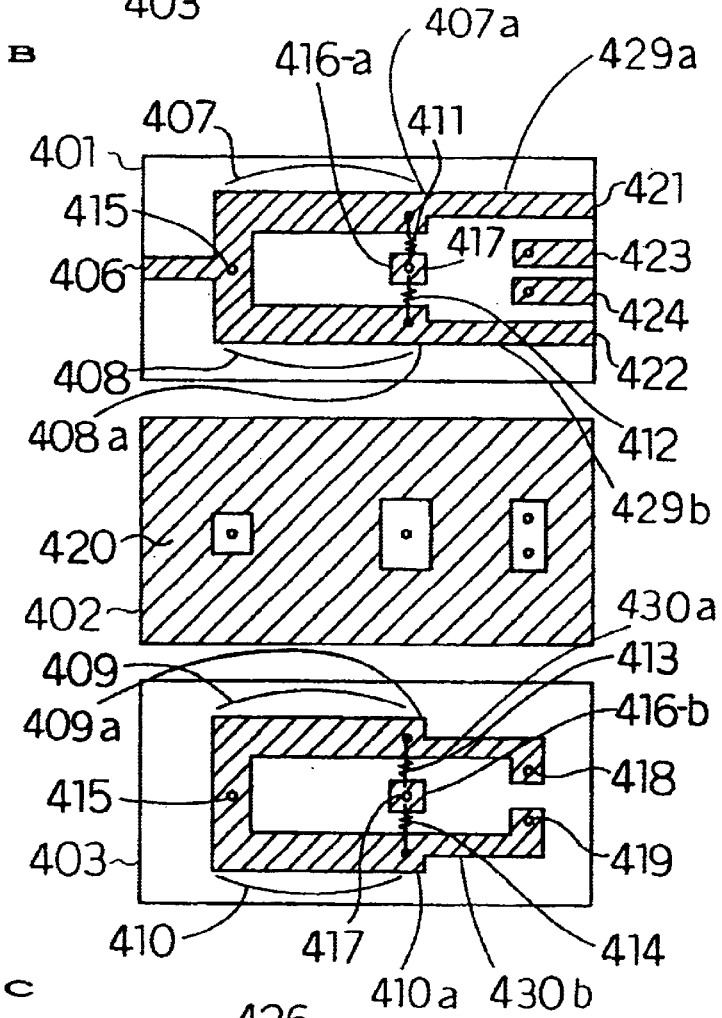
FIG. 4B is a view showing the conductor patterns of the four-way power splitter.
Figure 4C:
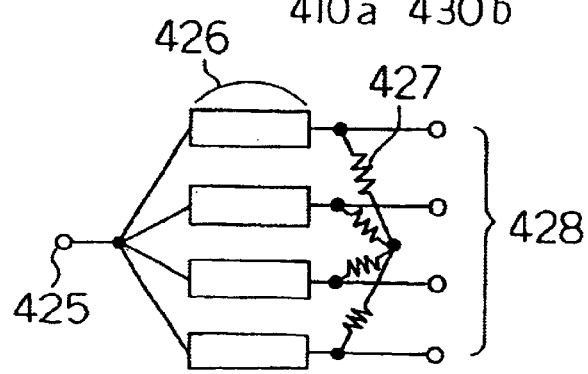
FIG. 4C is a circuit diagram of the four-way power splitter.

In this configuration, the four-way power splitters/combiners used for the present invention will be detailed below referring to FIGS. 4A to 4C. FIG. 4A is a sectional view showing the four-way power splitter/combiner formed of a dielectric multilayer board. FIG. 4B is a view showing the conductor patterns on the conductor pattern layers of the board. FIG. 4C is a circuit diagram of the four-way power splitter/combiner. Referring to FIG. 4A, the numerals 401, 402, 403 designate first to third conductor pattern layers, and the numerals 404, 405 designate the first and second dielectric layers. Referring to FIG. 4B, the numeral 406 designates an input terminal, the numerals 407, 408, 409, 410 designate first to fourth quarter-wavelength lines, the numerals 411, 412, 413, 414 designate first to fourth isolation resistors, the numeral 415 designates a first through hole, the numeral 416 designates a common terminal, the numerals 417, 418, 419 designate second to fourth through holes, the numeral 420 designates a shield conductor, and the numerals 421, 422, 423, 424 designate first to fourth split output terminals. Referring to FIG. 4C, the numeral 425 designates an input terminal, the numeral 426 designates quarter-wavelength lines, the numeral 427 designates isolation resistors, and the numeral 428 designates split output terminals.

Returning to FIG. 4B, the numeral 407a designates an end of the first quarter-wavelength line 407, away from the input terminal 406. The numeral 408a designates an end of the second quarter-wavelength line 408, away from the input terminal 406. The numeral 429a designates a first output line, and the numeral 429b designates a second output line.

Moreover, the numeral 409a designates an end of the third quarter-wavelength line 409, disposed on the opposite side of the first through hole 415. The numeral 410a designates an end of the fourth quarter-wavelength line 410, disposed on the opposite side of the first through hole 415. The numeral 430a designates a third output line, and the numeral 430b designates a fourth output line.

A method of embodying a non-planer Wilkinson four-way power splitter shown in FIG. 4C by using the dielectric three-layer board shown in FIG. 4A will be described below.

Examples of the first to third conductor pattern layers shown in FIG. 4A will be described below referring to FIG. 4B. A signal input from the input terminal 406 is split and propagated to the first quarter-wavelength line 407 and the second quarter-wavelength line 408, the two lines having the same characteristic impedance, and is also split and propagated to the third quarter-wavelength line 409 and the fourth quarter-wavelength line 410 via the first through hole 415. Furthermore, the other ends of the quarter-wavelength lines 407 to 410 are connected to the common terminal 416-a and the common terminal 416-b connected to the common terminal 416-a via the second through hole 417, by means of the first to fourth isolation resistors 411, 412, 413, and 414, respectively. These split outputs are propagated from the first to fourth split output terminals 421, 422, 423 and 424.

Furthermore, the shield conductor 420 surrounding the through holes is provided on the second conductor pattern layer 402 (see FIG. 4A) between the first conductor pattern layer 401 and the third conductor pattern layer 403 to prevent signal interference between the first conductor pattern layer 401 and the third conductor pattern layer 403. The four-way power splitter having the above-mentioned structure and the balun disclosed in the first embodiment are used to form a high power amplifier on the same dielectric multilayer board. Consequently, the number of components in the high power amplifier of the present embodiment can be made less than the number of components in a conventional high power amplifier comprising two eight-way power splitter circuits and 16 baluns, whereby the circuit can be made smaller. Moreover, since four-way splitting and four-way combining are carried out at one time, loss can be reduced, and the efficiency of the power amplifier can be improved.

The power splitter used in the above-mentioned second embodiment is a four-way power splitter type. However, four or more splits can be attained as desired by increasing the number of layers of the dielectric board. A six-way power splitter circuit formed of a dielectric five-layer board is shown in FIG. 5 as an example.

Figure 5:
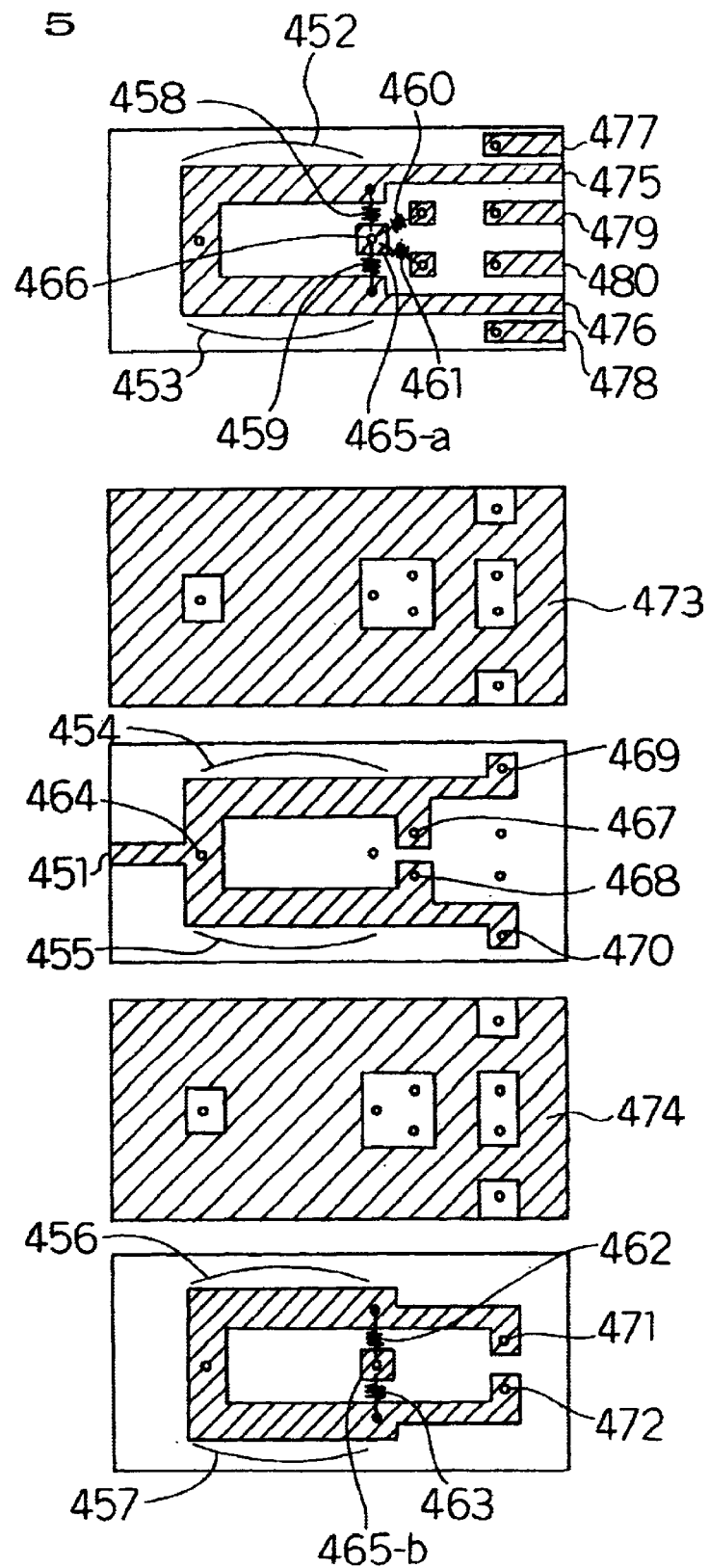
FIG. 5 is a view showing the conductor patterns of a six-way power splitter in accordance with another example of the second embodiment.

Referring to FIG. 5, the numeral 451 designates an input terminal, the numerals 452, 453, 454, 455, 456, 457 designate first to sixth quarter-wavelength lines, the numerals 458, 459, 460, 461, 462, 463 designate first to sixth isolation resistors, the numeral 464 designates a fist through hole, the numerals 465-a, 465-b designate common terminals, the numerals 466, 467, 468, 469, 470, 471, 472 designate second to eighth through holes, the numeral 473, 474 designate first and second shield conductors, and the numerals 475, 476, 477, 478, 479, 480 designate first to sixth split output terminals.

With this configuration, just as in the case of the four-way power splitter circuit of the second embodiment, a signal input from the input terminal 451 is split and propagated to six quarter-wavelength lines 452, 453, 454, 455, 456, 457 via the first through hole 464. Furthermore, the other ends of the quarter-wavelength lines 452, 453, 454, 455, 456, 457 are connected to the common terminal 465-a and the common terminal 465-b connected to the common terminal 465-a via the second through hole 466, by means of the first to sixth isolation resistors 458, 459, 460, 461, 462, 463, respectively. The isolation resisters 460, 461 for the third conductor pattern layer are taken out to the first conductor pattern layer via the third and fourth through holes 467, 468 respectively and connected to the common terminal 465-a. Although the third and fourth isolation resistors 460, 461 are taken out to the first conductor pattern layer in the above description, the same circuit can be obtained when the resistors are taken out to the fifth conductor pattern layer and connected to the common terminal 465-b.

Furthermore, by expanding this structure, a power splitter having a given number of splits can be formed. With this structure, just as in the case that the four-way power splitter circuits in accordance with the second embodiment is used, a high power amplifier having a large split number can be made smaller, and the number of components thereof can be reduced, whereby the efficiency of the power amplifier can be further improved.

As described above, in the high power amplifier in accordance with the present invention, the power splitter circuits and the baluns thereof are formed on a dielectric multilayer board, thereby offering advantages in that the number of components can be reduced and the circuits can be made smaller drastically, unlike conventional power splitter circuits and baluns which were large in size.

The splitter (combiner) and the balun of the high-output amplifier circuit in accordance with the above-mentioned present invention as well as those of the conventional high-output amplifier circuit are formed independently of each other.

However, instead of the independent formation, a balun circuit having the functions of a splitter (combiner) is desired to be embodied.

(Third Embodiment)

Figure 6:
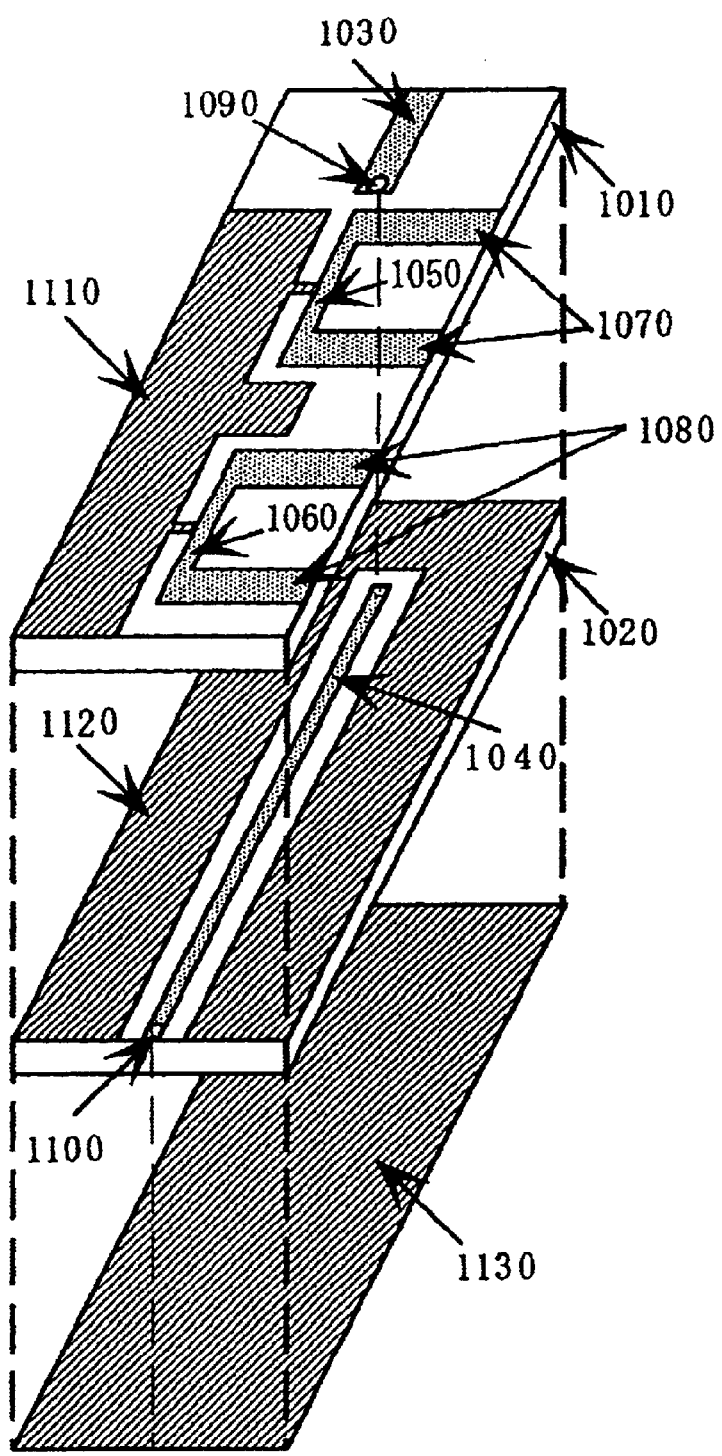
FIG. 6 is a view showing the configuration of a balun in accordance with a third embodiment of the invention.

FIG. 6 is a view showing the configuration of a balun in accordance with a third embodiment of the present invention. Referring to FIG. 6, the numerals 1010, 1020 designate first and second dielectric layers, the numeral 1030 designates an input line, the numeral 1040 designates a main line, the numeral 1050, 1060 designate first and second coupling lines, the numerals 1070, 1080 designate first and second output line pairs, the numerals 1090, 1100 designate first and second through holes, and the numerals 1110, 1120, 1130 designate first to third grounding conductors. Consider that the first to third grounding conductors 1110, 1120, 1130 have been electrically connected to one another via through holes or the like (not shown). Among the above-mentioned electrodes and lines, the electrodes and lines disposed on the same plane form each of layers, and these layers correspond to the conductor pattern layers in accordance with the present invention. These conductor pattern layers are alternately stacked with the first and second dielectric layers to form the multilayer in accordance with the present invention.

The operation of the balun having the above-mentioned configuration will be described below.

When a radio-frequency signal is input to the input line 1030, electromagnetic couplings occur between the main line 1040 and the first coupling line 1050 and between the main line 1040 and the second coupling line 1060, the first and second coupling lines 1050, 1060 being disposed adjacent to the main line 1040. When the two couplings have the same coupling degree, the radio-frequency signal is equally split and sent to the first and second coupling lines 1050, 1060. The split signal is further split into two equal signals, and the two signals are propagated to the two lines of the first output line pair 1070 connected to both ends of the first coupling line 1050, respectively. The two signals are 180 degrees out of phase with each other. In the same manner, two equally split radio signals 180 degrees out of phase with each other are also propagated to the two lines of the second output line pair 1080 connected to both ends of the second coupling line 1060, respectively. In other words, the balun circuit shown in FIG. 6 has the functions of a two-way power splitter as well as the functions of a balun. In addition, the coupling degree between the main line 1040 and the first and second coupling lines 1050, 1060 is determined depending on the dielectric constant and thickness of the first dielectric layer between the main line 1040 and the first and second coupling lines 1050, 1060, and the widths of the main line 1040 and the first and second coupling lines 1050, 1060.

With the configuration shown in FIG. 6, the circuit can be made even more smaller in comparison with the configuration wherein the splitter (combiner) and the balun are formed independently of each other.

It has been described that two coupling lines are used in the above-mentioned embodiment of the present invention, and that the balun in accordance with the present embodiment has a two-way splitting function. However, in addition to these configurations, a balun circuit having three or more coupling lines and an N-way splitting function may also be used.

Furthermore, it has been described that the two coupling lines in accordance with the present embodiment of the present invention are formed on the same conductor pattern layer. However, in addition to this configuration, the two coupling lines may be formed separately on different conductor pattern layers other than the conductor pattern layer on which the main line is formed.

Furthermore, it has been described that the main line in accordance with the present embodiment of the present invention is formed only on an conductor pattern layer. However, the main line may be formed across a plurality of conductor pattern layers.

Moreover, it has been described that the coupling degree between the main line and one of the two coupling lines is the same as that between the main line and the other coupling line. However, different coupling degrees may be used to form a balun having an asymmetrical splitting function.

(Fourth Embodiment)

Figure 7:
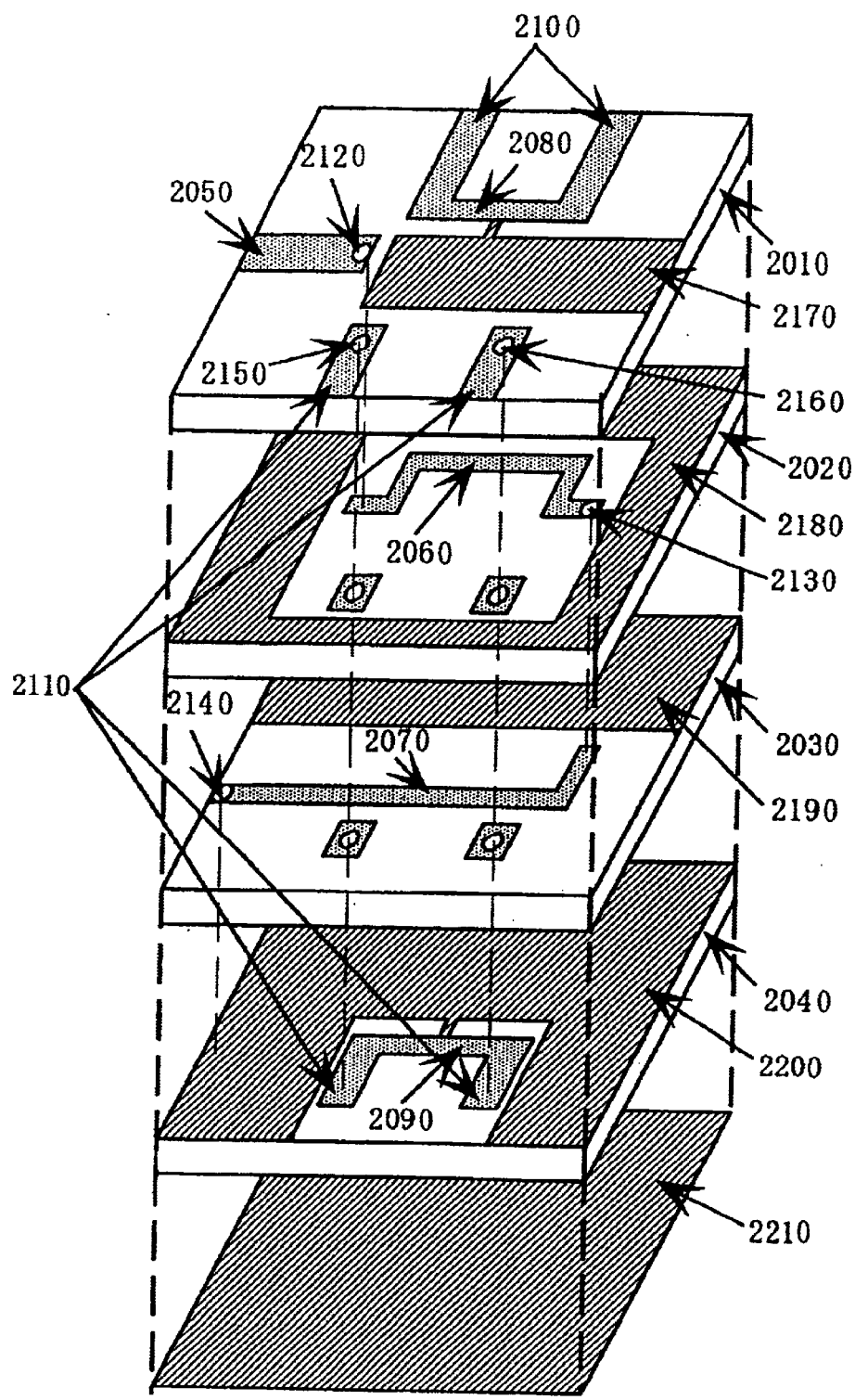
FIG. 7 is a view showing the configuration of a balun in accordance with a fourth embodiment of the invention.

Next, a fourth embodiment of the present invention will be described below referring to the accompanying drawing. FIG. 7 is a view showing a balun in accordance with the fourth embodiment of the present invention. Referring to FIG. 7, the numerals 2010, 2020, 2030, 2040 designate first to fourth dielectric layers, the numeral 2050 designates an input line, the numerals 2060, 2070 designate first and second main line portions, the numerals 2080, 2090 designate first and second coupling lines, the numerals 2100, 2110 designate first and second output line pairs, the numerals 2120, 2130, 2140, 2150, 2160 designate first to fifth through holes, and the numerals 2170, 2180, 2190, 2200, 2210 designate first to fifth grounding conductors. The first to fifth grounding conductors 2170, 2180, 2190, 2200, 2210 are connected electrically to one another via through holes or the like (not shown). Among the above-mentioned electrodes and lines, the electrodes and lines disposed on the same plane form each of layers, and these layers correspond to the conductor pattern layers in accordance with the present invention. These conductor pattern layers are alternately stacked with the first to fourth dielectric layers 2010, 2020, 2030, and 2040 to form the multilayer in accordance with the present invention. In addition, the first and second main line portions 2060, 2070 and the second through hole 2130 used to connect the first and second main line portions form the main line in accordance with the present invention. The coupling degree between the first main line portion 2060 and the first coupling line 2080 is the same as that between the second main line portion 2070 and the second coupling line 2090.

The operation of the balun having the above-mentioned configuration is the same as that in accordance with the third embodiment.

With the configuration shown in FIG. 7, the mount area of the balun circuit can be made smaller than that of the balun circuit in accordance with the third embodiment wherein the first and second coupling lines are formed on the same plane.

It has been described that two coupling lines are in the above-mentioned embodiment of the present invention, and that the balun in accordance with the present embodiment has a two-way splitting function. However, in addition to these configurations, a balun circuit having three or more coupling lines and an N-splitting function may also be used. In this case, a plurality of main line portions may be disposed on the same conductor pattern layer wherein the plural main line portions may not be connected directly to one another on the conductor pattern layer.

Furthermore, in the above-mentioned embodiment of the present invention, it has been described that only one coupling line is formed on an conductor pattern layer. However, in addition to this configuration, two or more coupling lines may be formed on an conductor pattern layer.

Furthermore, in the above-mentioned embodiment, it has been described that the main line portions and the coupling lines are all formed on different conductor pattern layers. However, a main line portion and a coupling line not coupled to each other may be formed on the same conductor pattern layer. With this configuration, the number of the dielectric layers and the number of the conductor pattern layers to be stacked with one another can be reduced.

Moreover, it has been described that the coupling degree between one of the two main line portions and one of the two coupling lines is the same as that between the other main line portion and the other coupling line. However, different coupling degrees may be used to form a balun having an asymmetrical splitting function.

(Fifth Embodiment)

Figure 8:
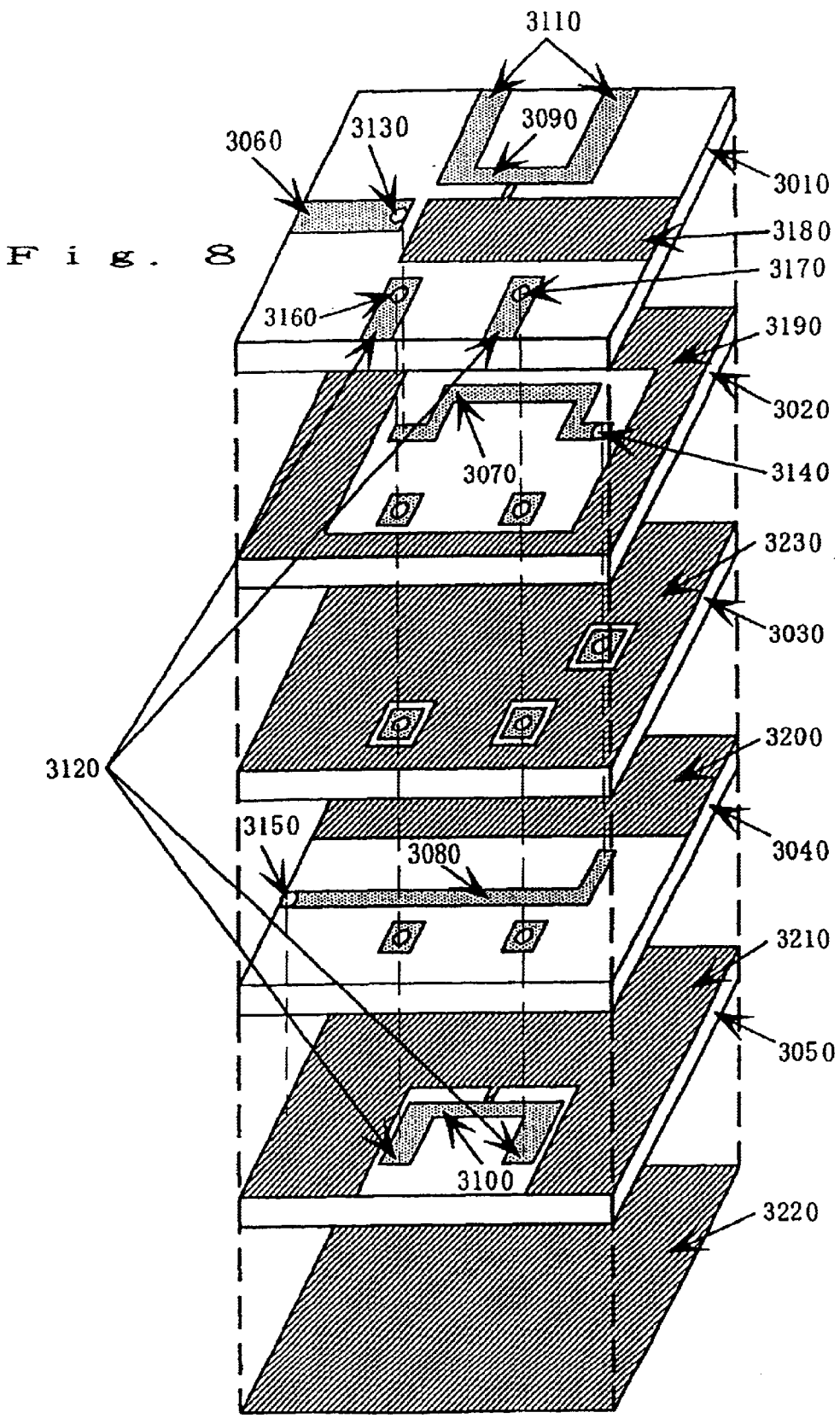
FIG. 8 is a view showing the configuration of a balun in accordance with a fifth embodiment of the invention.

Next, a fifth embodiment of the present invention will be described below referring to the accompanying drawing. FIG. 8 is a view showing the configuration of a balun in accordance with the fifth embodiment of the present invention. Referring to FIG. 8, the numerals 3010, 3020, 3030, 3040, 3050 designate first to fifth dielectric layers, the numeral 3060 designates an input line, the numerals 3070, 3080 designate first and second main line portions, the numerals 3090, 3100 designate first and second coupling lines, the numerals 3110, 3120 designate first and second output line pairs, the numerals 3130, 3140, 3150, 3160, 3170 designate first to fifth through holes, the numerals 3180, 3190, 3200, 3210 and 3220 designate first to fifth grounding conductors, and the numeral 3230 designates a shield conductor layer. The first to fifth grounding conductors are connected electrically to the shield conductor layer 3230 via through holes or the like (not shown). Among the above-mentioned electrodes and lines, the electrodes and lines disposed on the same plane form each of layers, and these layers correspond to the conductor pattern layers in accordance with the present invention. These conductor pattern layers and the shield conductor layer 3230 are alternately stacked with the first to fifth dielectric layers 3010 to 3050 to form the multilayer board in accordance with the present invention. In addition, the first and second main line portions 3070, 3080 and the second through hole 3140 used to connect the first and second main line portions to each other form the main line in accordance with the present invention. The coupling degree between the first main line portion 3070 and the first coupling line 3090 is the same as that between the second main line portion 3080 and the second coupling line 3100.

The operation of the balun having the above-mentioned configuration is the same as that in accordance with the third embodiment, except the operation regarding the shield conductor layer 3230.

The present embodiment is provided with the shield conductor layer 3230 to prevent unnecessary coupling between the first main line portion 3070 and the second main line portion 3080, unnecessary coupling between the first main line portion 3070 and the second coupling line 3100, and unnecessary coupling between the second main line portion 3080 and the first coupling line 3090.

It has been described that two coupling lines are used in the above-mentioned embodiment of the present invention, and that the balun in accordance with the present embodiment has a two-way splitting function. However, in addition to these configurations, a balun circuit having three or more coupling lines and an N-way splitting function may also be used. In this case, a plurality of main line portions may be disposed on the same conductor pattern layer wherein the plural main line portions may not be connected directly to one another on the conductor pattern layer.

Furthermore, in the above-mentioned embodiment, it has been described that only one coupling line is formed on an conductor pattern layer. However, in addition to this configuration, two or more coupling lines may be formed on an conductor pattern layer.

Furthermore, in the above-mentioned embodiment, it has been described that the main line portions and the coupling lines are all formed on different conductor pattern layers. However, a main line portion and a coupling line not coupled to each other may be formed on the same conductor pattern layer. With this configuration, the number of the dielectric layers and the number of the conductor pattern layers to be stacked can be reduced.

Moreover, it has been described that the coupling degree between one of the two main line portions and one of the two coupling lines is the same as that between the other main line portion and the other coupling line. However, different coupling degrees may be used to form a balun having an asymmetrical splitting function.

Furthermore, it has been described that the shield conductor in accordance with the above-mentioned embodiment of the present invention is formed on the entire surface of an conductor pattern layer. However, in addition to this configuration, the shield conductor may be formed on a plurality of conductor pattern layers, or formed on a part of an conductor pattern layer on which other electrodes and lines are formed, provided that the shield conductor is disposed on an conductor pattern layer sandwiched between at least two of the plural conductor pattern layers across which the main line is disposed.

Figure 9:
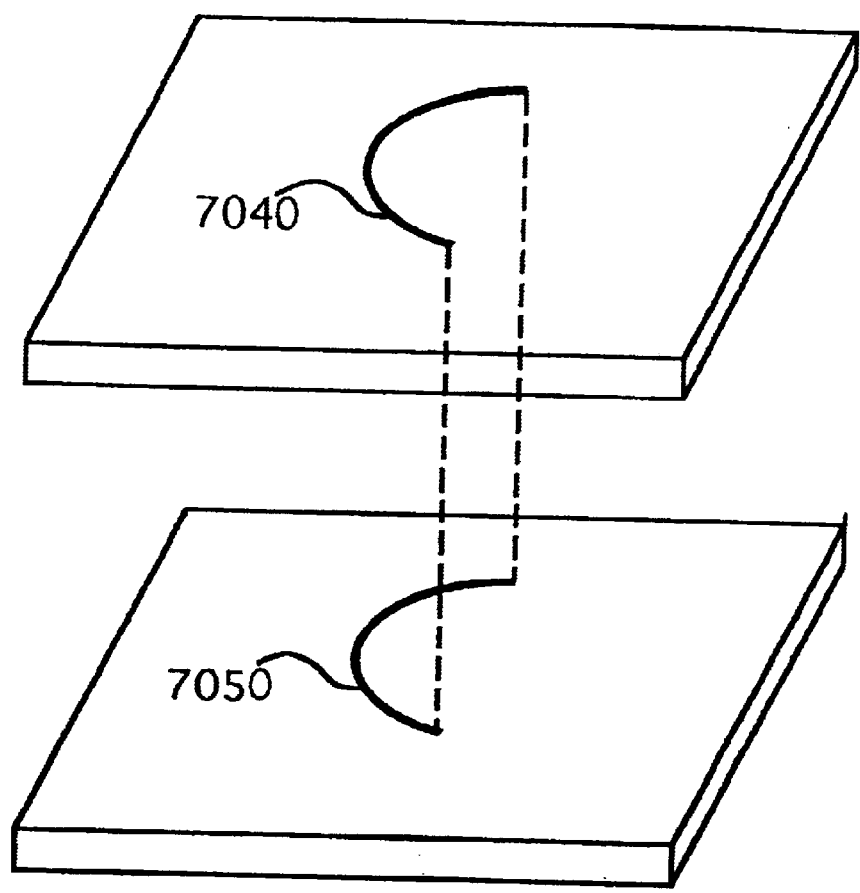
FIG. 9 is a view showing an example of the arrangement relationship between a part of the main line and a coupling line in the balun of the present invention.
Figure 10:
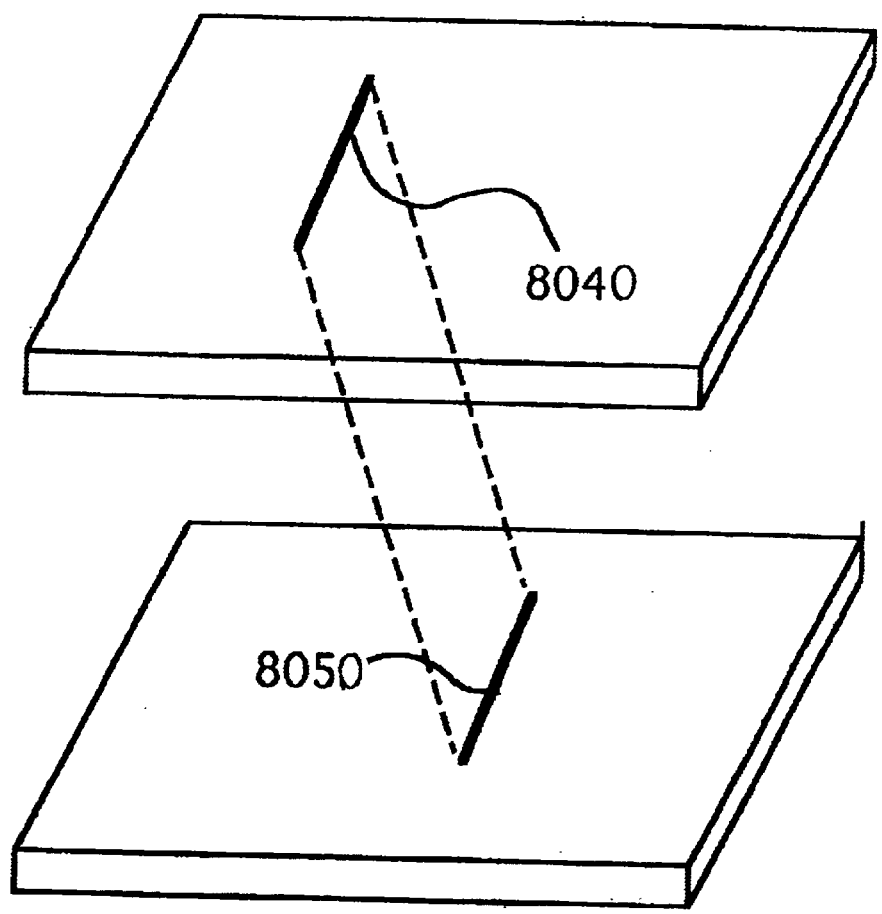
FIG. 10 is a view showing another example of the arrangement relationship between a part of the main line and a coupling line in the balun of the present invention.
Figure 11:
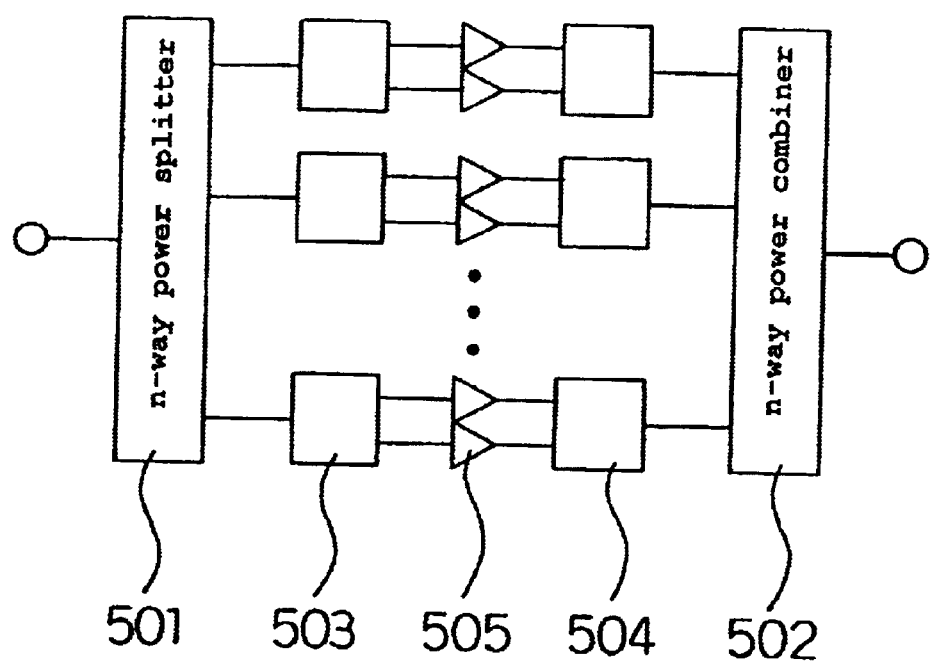
FIG. 11 is a view showing the configuration of a conventional high power amplifier.
Figure 12A:
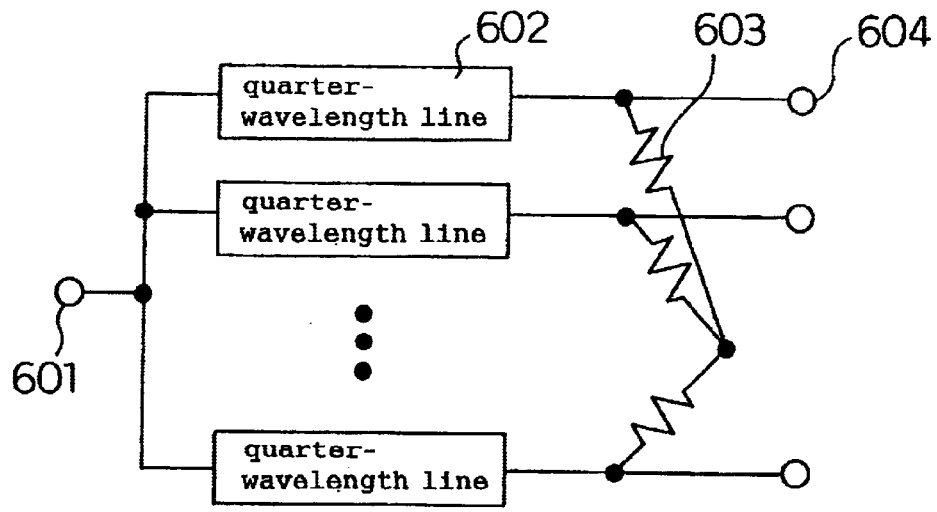
FIG. 12A is a circuit diagram of a general Wilkinson power splitter.
Figure 12B:
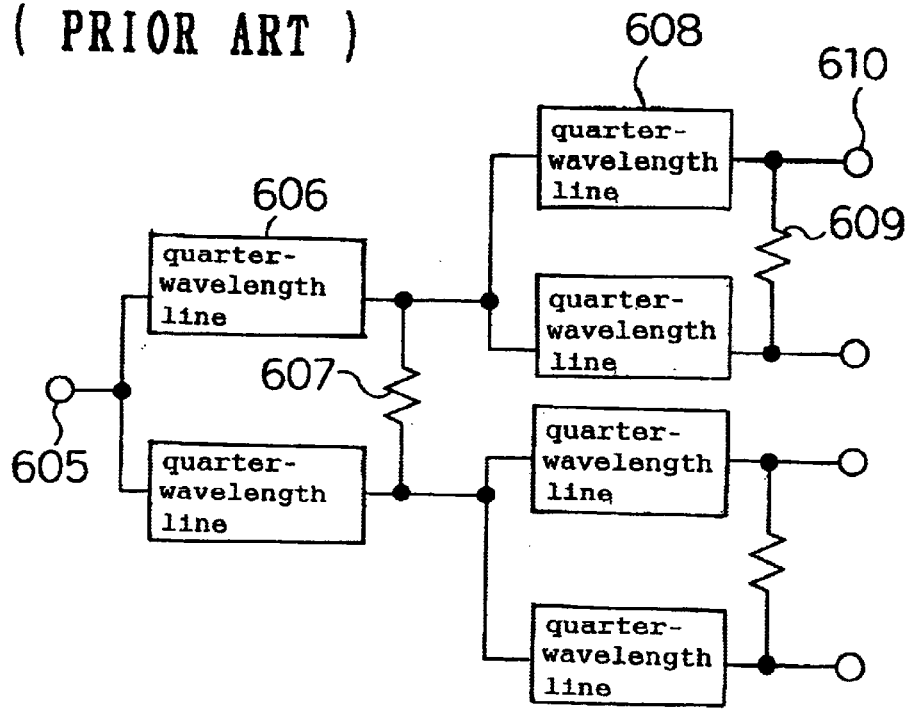
FIG. 12B is a circuit diagram of a one input, multi-splitter comprising a Wilkinson two-way power splitter.
Figure 13:
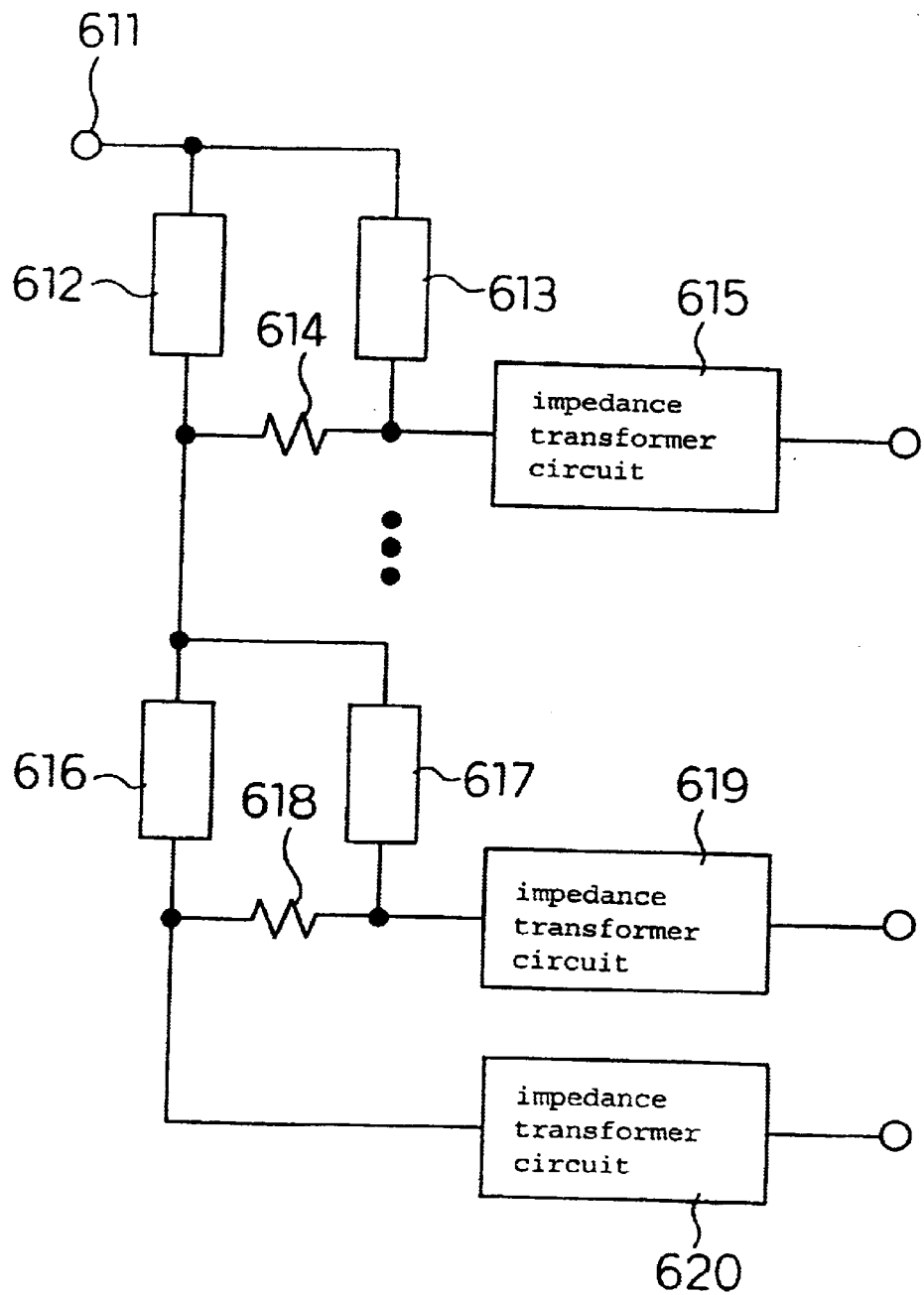
FIG. 13 is a circuit diagram of a one-input, multi-splitter comprising a Wilkinson asymmetric power splitter.
Figure 14:
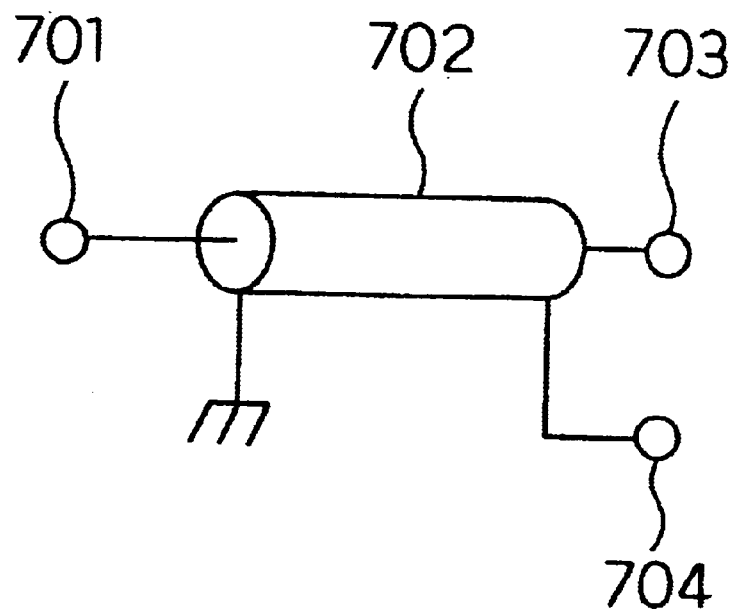
FIG. 14 is a view showing the configuration of a conventional balun for a high power amplifier.

Moreover, it has been described that all the portions of the main and coupling lines are formed of straight lines in the above-mentioned third to fifth embodiments of the present invention. However, in addition to this configuration, a part or all of the lines may be formed of a curve, provided that a part of the main line and a coupling line being in face-to-face relationship to each other are disposed so as to be superimposed on each other in a direction perpendicular to the surfaces of the conductor pattern layers, like the relationship between the part 7040 of the main line and the coupling line 7050 shown in FIG. 9. Additionally, a part of the main line and a coupling line being in face-to-face relationship to each other may be disposed so as to be superimposed on each other when the coupling line is moved only in a direction perpendicular to the lengthwise direction of the main line but not rotated, like the relationship between the part 8040 of the main line and the coupling line 8050 shown in FIG. 10. In short, the coupling line facing the part of the main line should only be disposed on the conductor pattern layer other than the conductor pattern layer on which the part of the main line is disposed, so as to electromagnetically couple with the part of the main line which the coupling line faces. However, the coupling degree in the case that the coupling line is disposed so as to be superimposed on the part of the main line when the coupling line is moved in a direction perpendicular to the lengthwise direction of the part of the line but not rotated is smaller than that in the case that the coupling line and the part of the main line are superimposed completely on each other in a direction perpendicular to the surfaces of the conductor pattern layers.

As clearly disclosed by the above descriptions, the present invention can provide a balun capable of being made small in circuit size by incorporating the functions of a splitter (combiner). Consequently, the present invention is effective in miniaturizing a high power amplifier wherein a plurality of push-pull amplifiers are combined in parallel.

What is claimed is:

1. A power splitter or combiner circuit comprising:

first and second stacked dielectric plates;

a shield grounding conductor disposed between said first and second dielectric plates;

a transmission line comprised of a conductor pattern on said first dielectric plate on the opposite side of said shield grounding conductor, and having an input terminal on an end thereof, and having a first through hole on the other end thereof;

first and second quarter-wave length lines with ends thereof commonly connected to said transmission line, and other ends thereof provided with first and second output lines respectively; first and second isolation resistors connected to said other ends of said first and second quarter-wavelength lines, respectively;

a common terminal connected to the other ends of said first and second isolation resistors, and provided with a second through hole;

third and fourth quarter-wavelength lines disposed parallel to each other, each comprised of a conductor pattern on said second dielectric plate on the opposite side of said shield grounding conductor, and ends thereof commonly connected electrically via said first through hole;

third and fourth output lines connected to the other ends of said third and fourth quarter-wavelength lines respectively;

third and fourth isolation resistors connected to said other ends of said third and fourth quarter-wavelength lines respectively; and a common terminal connected to the other ends of said third and fourth absorption resistances, and having a through hole connected to said second through hole.

2. A power splitter or combiner circuit in accordance with claim 1, wherein a first plurality of said lines comprised of conductor patterns are disposed on said first dielectric plate, and a second plurality of said lines are disposed on a third dielectric plate stacked on said first dielectric plate via another shield grounding conductor.

* * * * *

UNITED STATES PATENT AND TRADEMARK OFFICE
CERTIFICATE OF CORRECTION

PATENT NO. : 6,690,249 B2
DATED : February 10, 2004
INVENTOR(S) : Kaoru Ishida et al.

It is certified that error appears in the above-identified patent and that said Letters Patent is hereby corrected as shown below:

<u>Title page,</u>
Item [62], Related U.S. Application Data, change "filed on "Sep. 4, 1998," to -- filed on Sep. 9, 1998. --

Signed and Sealed this

Twenty-fifth Day of May, 2004

JON W. DUDAS
*Acting Director of the United States Patent and Trademark Office*